(12) United States Patent
Kadoguchi et al.

(10) Patent No.: US 9,224,662 B2
(45) Date of Patent: Dec. 29, 2015

(54) SEMICONDUCTOR APPARATUS

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Takuya Kadoguchi, Toyota (JP); Takahiro Hirano, Toyota (JP); Tomomi Okumura, Anjo (JP); Keita Fukutani, Anjo (JP); Masayoshi Nishihata, Nagoya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 14/528,383

(22) Filed: Oct. 30, 2014

(65) Prior Publication Data
US 2015/0162274 A1    Jun. 11, 2015

(30) Foreign Application Priority Data

Dec. 6, 2013  (JP) ................................. 2013-253583
Mar. 10, 2014  (JP) ................................. 2014-046593

(51) Int. Cl.
| H01L 23/498 | (2006.01) |
| H01L 23/047 | (2006.01) |
| H01L 23/495 | (2006.01) |
| H01L 21/56 | (2006.01) |
| H01L 23/051 | (2006.01) |
| H01L 23/433 | (2006.01) |
| H01L 23/31 | (2006.01) |

(52) U.S. Cl.
CPC ............ *H01L 23/047* (2013.01); *H01L 21/565* (2013.01); *H01L 23/051* (2013.01); *H01L 23/49537* (2013.01); *H01L 23/49541* (2013.01); *H01L 23/49548* (2013.01); *H01L 23/49562* (2013.01); *H01L 23/49575* (2013.01); *H01L 23/3107* (2013.01); *H01L 23/4334* (2013.01); *H01L 2224/32245* (2013.01); *H01L 2224/45144* (2013.01); *H01L 2224/45147* (2013.01); *H01L 2224/48091* (2013.01); *H01L 2224/48247* (2013.01); *H01L 2924/13055* (2013.01)

(58) Field of Classification Search
CPC ........... H01L 2224/48247; H01L 2924/00014; H01L 33/52; H01L 2023/4031; H01L 2023/405; H01L 23/49541; H01L 23/49548; H01L 23/49811; H01L 23/3142; H01L 23/047; H01L 23/49838
See application file for complete search history.

(56) References Cited

U.S. PATENT DOCUMENTS

2012/0313252 A1* 12/2012 Ueda et al. .................... 257/773
2014/0035112 A1   2/2014 Kadoguchi et al.

FOREIGN PATENT DOCUMENTS

| JP | A-2012-89681 | 5/2012 |
| JP | A-2012-114455 | 6/2012 |

(Continued)

*Primary Examiner* — Roy Potter
(74) *Attorney, Agent, or Firm* — Oliff PLC

(57) ABSTRACT

A semiconductor apparatus is disclosed, which includes a semiconductor element provided on a plane; a sealing resin that seals the semiconductor element; a terminal that is electrically connected to the semiconductor element and includes a part that projects from a predetermined surface of the sealing resin; and a concave portion that is recessed toward a side of the semiconductor element from the predetermined surface, when viewed in a direction perpendicular to the plane. A side of the concave portion on the side of the semiconductor element includes a rounded shape, when viewed in the direction perpendicular to the plane.

10 Claims, 16 Drawing Sheets

(56) References Cited

FOREIGN PATENT DOCUMENTS

| JP | A-2012-235081 | 11/2012 |
| JP | A-2013-102242 | 5/2013 |
| JP | A-2013-110181 | 6/2013 |
| JP | A-2014-154779 | 8/2014 |
| JP | A-2014-154780 | 8/2014 |

* cited by examiner

FIG.25
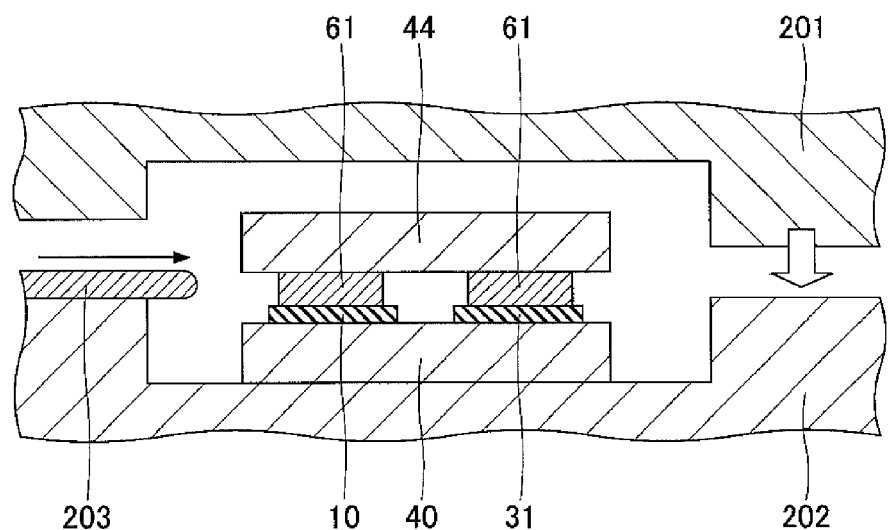
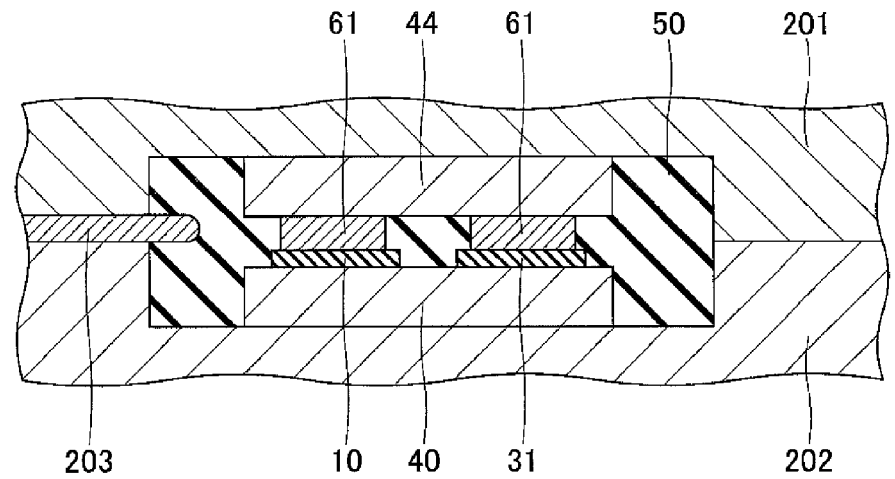
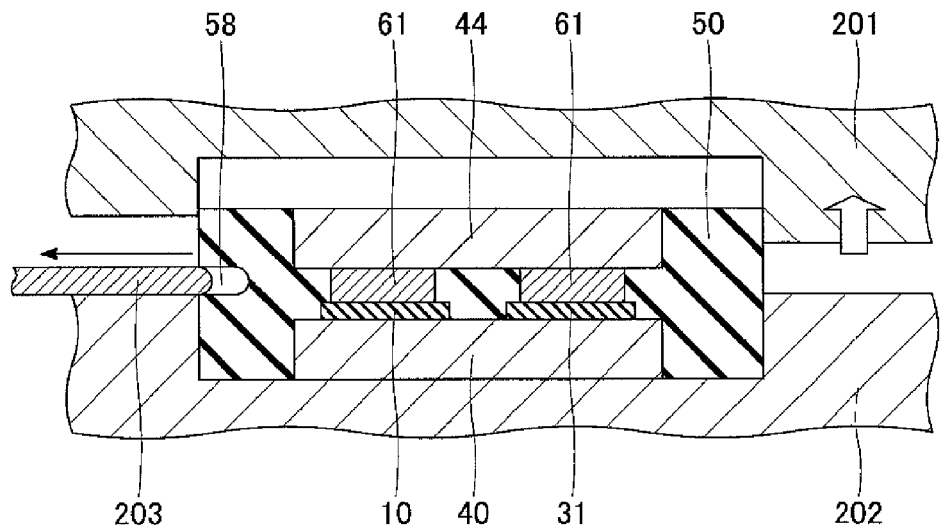

US 9,224,662 B2

SEMICONDUCTOR APPARATUS

FIELD

The disclosure is related to a semiconductor apparatus.

BACKGROUND

Recently, a semiconductor apparatus is known in which metal plates are electrically and thermally connected to upper and lower surfaces of a plurality of semiconductor elements and are sealed by a sealing resin (see Japanese Laid-open Patent Publication No. 2012-235081, for example). An example of such a semiconductor apparatus includes semiconductor elements such as Insulated Gate Bipolar Transistors (IGBTs), diodes, etc., arranged side by side in lateral and longitudinal directions.

The IGBT corresponds to a transistor that is formed by replacing a base of a bipolar transistor with a gate of a field-effect transistor (FET), and has high speed and withstand electric power characteristics of the bipolar transistor that is of a current-driven type as well as electric power saving characteristics of the field-effect transistor that is of a voltage-driven type. Thus, the semiconductor apparatus as described above can be used as a power semiconductor apparatus that performs switching operations.

With respect to such a semiconductor apparatus as described above, a concave portion may be provided in a resin portion for reserving a creepage distance. However, there may be a case where heat generated by the semiconductor elements causes a stress concentration at the concave portion.

Therefore, an object of this disclosure is to provide a semiconductor apparatus that can reduce a stress concentration at a concave portion that is provided for increasing a creepage distance.

SUMMARY

According to one aspect of the disclosure, a semiconductor apparatus is provided, which includes:
a semiconductor element provided on a plane;
a sealing resin that seals the semiconductor element;
a terminal that is electrically connected to the semiconductor element and includes a part that projects from a predetermined surface of the sealing resin; and
a concave portion that is recessed toward a side of the semiconductor element from the predetermined surface, when viewed in a direction perpendicular to the plane, wherein
a side of the concave portion on the side of the semiconductor element includes a rounded shape, when viewed in the direction perpendicular to the plane.

BRIEF DESCRIPTION OF DRAWINGS

FIG. 25 is a plane view (No. 2) illustrating an example of a production process of the semiconductor apparatus according to the tenth variant of the first embodiment.

DESCRIPTION OF EMBODIMENTS

Figure 1:
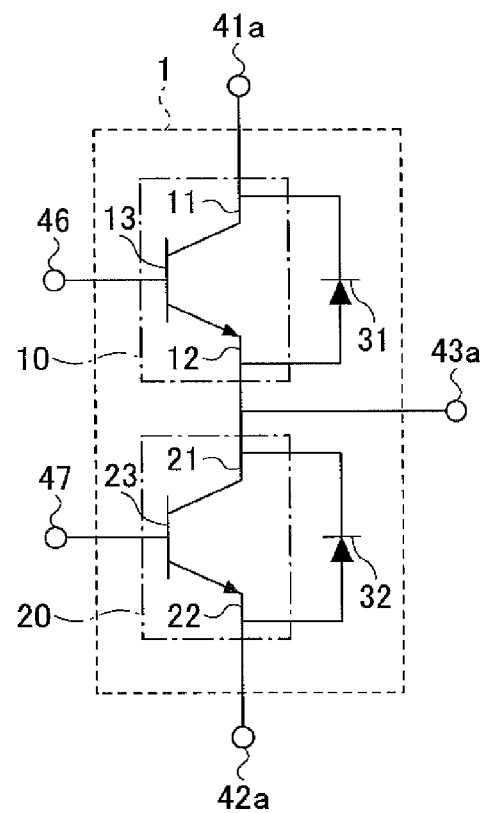
FIG. 1 is a diagram illustrating a circuit configuration of a semiconductor apparatus according to a first embodiment.

In the following, embodiments will be described by referring to the accompanying drawings. In the embodiments described hereinafter, an explanation is made with respect to a semiconductor apparatus in which four semiconductor elements (two IGBTs and two diodes) are arranged side by side in lateral and longitudinal directions; however, this is not indispensable. It is noted that in the respective drawings, the same elements are indicated by the same reference numerals, and explanation may be omitted to avoid overlaps.

[First Embodiment]

At first, a circuit configuration of a semiconductor apparatus according to a first embodiment is described. FIG. 1 is a diagram illustrating a circuit configuration of a semiconductor apparatus according to a first embodiment. With reference to FIG. 1, a semiconductor apparatus 1 according to a first embodiment is an inverter circuit that includes IGBTs 10 and 20 and diodes 31 and 32.

In the semiconductor apparatus 1, the IGBT 10 includes a collector electrode 11, an emitter electrode 12 and a gate electrode 13. Further, the IGBT 20 includes a collector electrode 21, an emitter electrode 22 and a gate electrode 23.

The collector electrode 11 of the IGBT 10 is electrically connected to a cathode of the diode 31 and a high-voltage side power supply terminal 41a. The emitter electrode 12 of the IGBT 10 is electrically connected to an anode of the diode 31. In other words, the diode 31 is connected to the IGBT 10 by an inverse-parallel connection. The gate electrode 13 of the IGBT 10 is electrically connected to at least one of control electrode terminals 46.

The emitter electrode 22 of the IGBT 20 is electrically connected to a cathode of the diode 32 and a low-voltage side power supply terminal 42a. The collector electrode 21 of the IGBT 20 is electrically connected to a cathode of the diode 32. In other words, the diode 32 is connected to the IGBT 20 by an inverse-parallel connection. The gate electrode 13 of the IGBT 20 is electrically connected to at least one of the control electrode terminals 47.

Further, the emitter electrode 12 of the IGBT 10 is electrically connected to the collector electrode 21 and an output terminal 43a. It is noted that the voltage applied to the high-voltage side power supply terminal 41a, a low-voltage side power supply terminal 42a and the output terminal 43a is higher than that applied to the control electrode terminals 46 and 47, and thus these three terminals 41a, 42a and 43a are collectively referred to as "high-voltage terminals" hereinafter.

Figure 2:
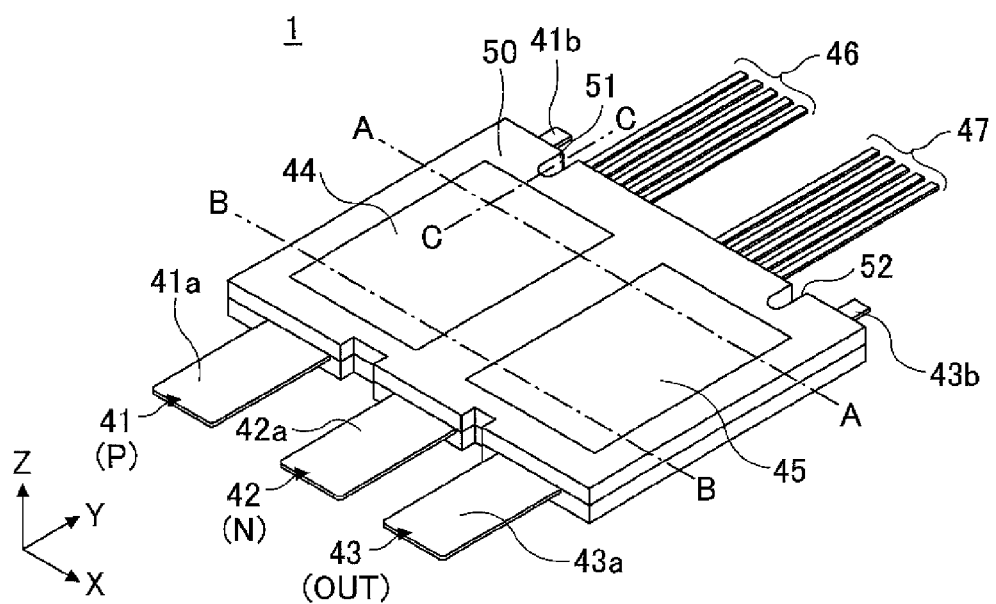
FIG. 2 is a perspective view illustrating an example of the semiconductor apparatus according to the first embodiment.
Figure 3:
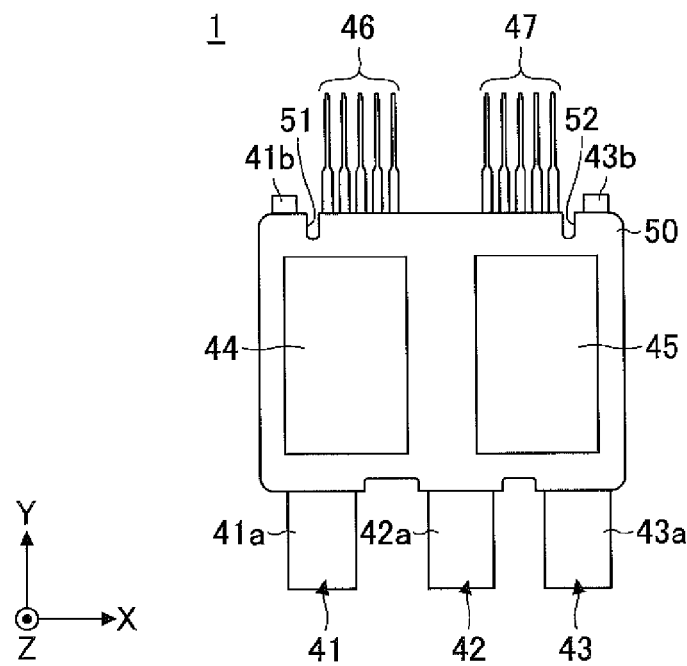
FIG. 3 is a plane view illustrating an example of the semiconductor apparatus according to the first embodiment.
Figure 4:
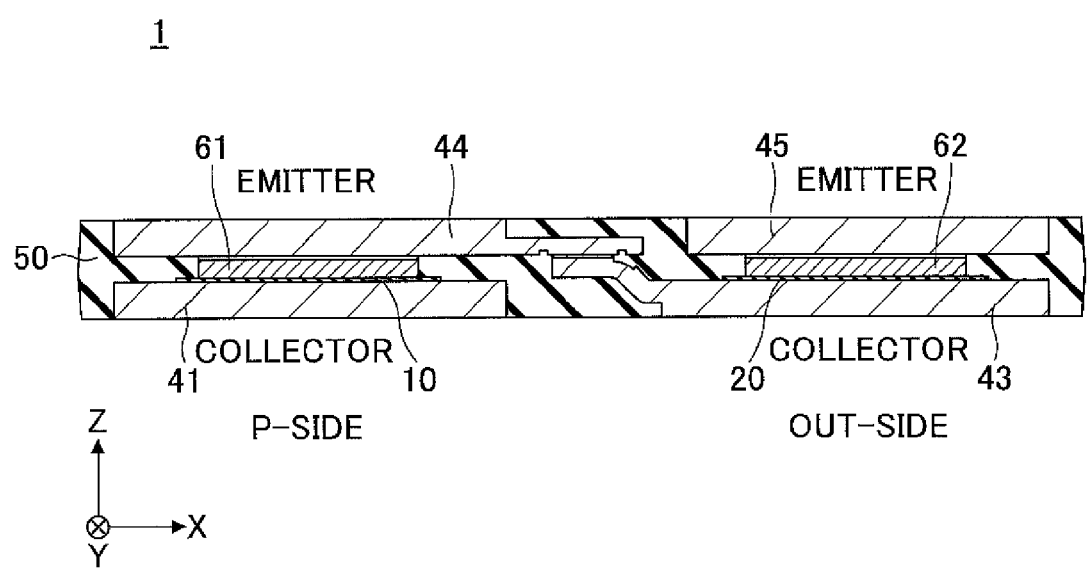
FIG. 4 is a cross-sectional view along a line A-A in FIG. 2 illustrating an example of the semiconductor apparatus according to the first embodiment.
Figure 5:
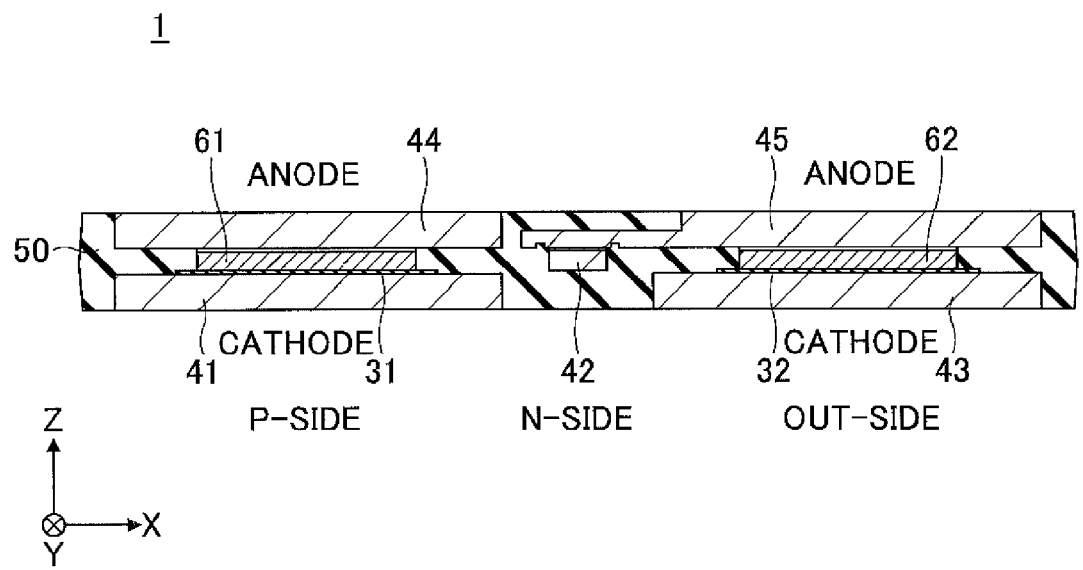
FIG. 5 is a cross-sectional view along a line B-B in FIG. 2 illustrating an example of the semiconductor apparatus according to the first embodiment.
Figure 6:
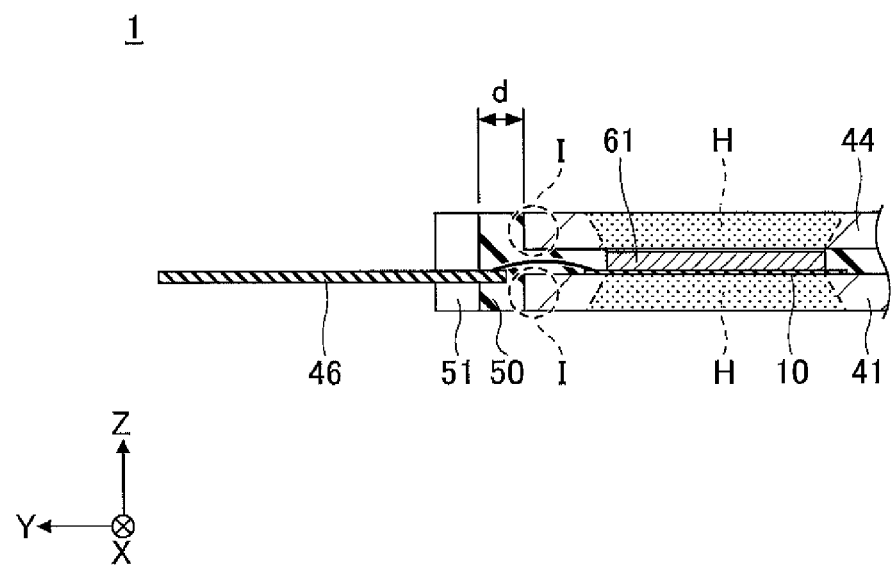
FIG. 6 is a cross-sectional view along a line C-C in FIG. 2 illustrating an example of the semiconductor apparatus according to the first embodiment.
Figure 7:
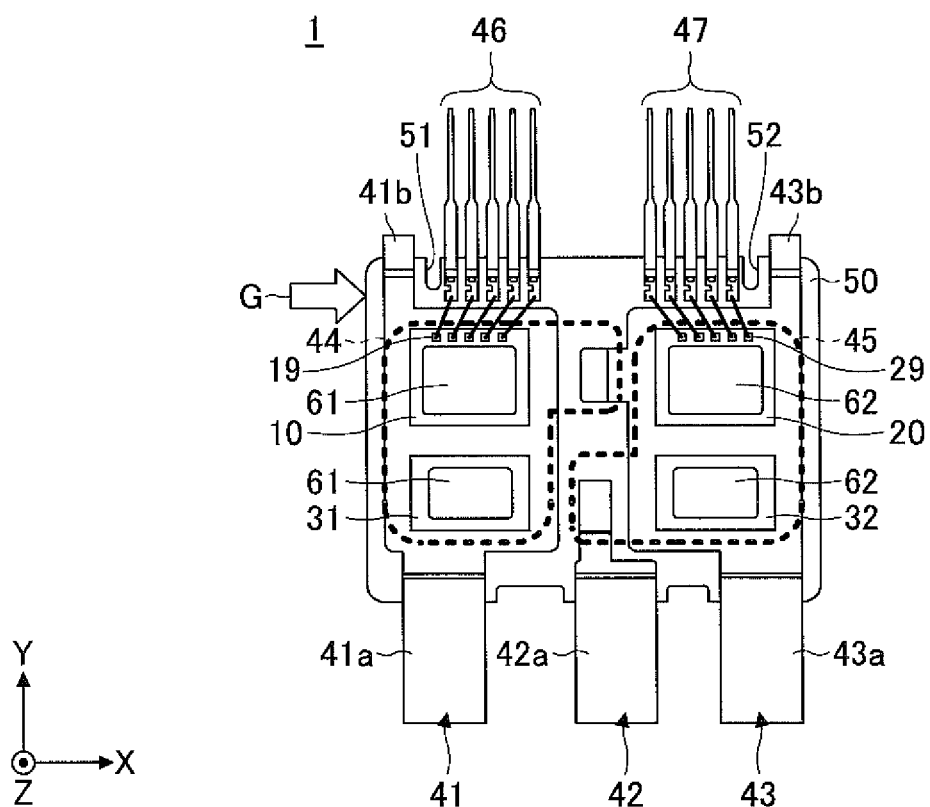
FIG. 7 is a plane view illustrating an example of an internal construction of the semiconductor apparatus according to the first embodiment.

Next, a construction of a semiconductor apparatus according to the first embodiment is described. FIG. 2 is a perspective view illustrating an example of the semiconductor apparatus according to the first embodiment. FIG. 3 is a perspective view illustrating an example of the semiconductor apparatus according to the first embodiment. FIG. 4 is a cross-sectional view along a line A-A in FIG. 2 illustrating an example of the semiconductor apparatus according to the first embodiment. FIG. 5 is a cross-sectional view along a line B-B in FIG. 2 illustrating an example of the semiconductor apparatus according to the first embodiment. FIG. 6 is a cross-sectional view along a line C-C in FIG. 2 illustrating an example of the semiconductor apparatus according to the first embodiment. FIG. 7 is a perspective view illustrating an example of the semiconductor apparatus according to the first embodiment.

It is noted that, in this specification, it is assumed that, in the semiconductor apparatus 1, metal plates 44 and 45 are exposed at an upper surface, and metal plates 41 and 43 are exposed at a lower surface. Further, it is assumed that the high-voltage side power supply terminal 41a, the low-voltage side power supply terminal 42a and the output terminal 43a project from a front surface. Further, it is assumed that a suspending lead terminal 41b, a suspending lead terminal 43b, the control electrode terminals 46 and 47 project from a back surface. Further, it is assumed that other surfaces are side surfaces.

Referring to FIGS. 2 through 7, in the semiconductor apparatus 1, the metal plate 41, which includes the high-voltage side power supply terminal 41a and the suspending lead terminal 41b, a metal plate 42, which includes the low-voltage side power supply terminal 42a, and the metal plate 43, which includes the output terminal 43a and the suspending lead terminal 43b, are arranged in parallel with a predetermined distance such that longitudinal directions of the metal plates 41, 42 and 43 are substantially the same (Y direction).

Further, the control electrode terminals 46 are provided such that a plurality of metal lead terminals are arranged in parallel and spaced with a predetermined distance such that longitudinal directions thereof are substantially the same as the longitudinal direction of the metal plate 41 (Y direction). Further, the control electrode terminals 47 are provided such that a plurality of metal lead terminals are arranged in parallel and spaced with a predetermined distance such that longitudinal directions thereof are substantially the same as the longitudinal direction of the metal plate 43 (Y direction).

The metal plates 41, 42 and 43, and the control electrode terminals 46 and 47 may be formed of copper (Cu), nickel (Ni), aluminum (Al), etc., for example. Surfaces of the metal plates 41, 42 and 43, and the control electrode terminals 46 and 47 may be plated with silver (Ag), gold (Au), etc.

The IGBT 10 is installed on an upper surface of the metal plate 41 such that there is continuity between the collector electrode 11 and the metal plate 41 via an electrically conductive bonding material (not illustrated) such as a tin-based solder, etc. It is noted that a side of the metal plate 41 to which the collector electrode 11 is connected is also referred to as a "P-side". Further, the diode 31 is installed on an upper surface of the metal plate 41 such that there is continuity between the cathode and the metal plate 41 via an electrically conductive bonding material (not illustrated) such as a tin-based solder, etc. The IGBT 10 and the diode 31 are arranged in the longitudinal direction (Y direction) of the metal plate 41.

The IGBT 20 is installed on an upper surface of the metal plate 43 such that there is continuity between the collector electrode 21 and the metal plate 43 via an electrically conductive bonding material (not illustrated) such as a tin-based solder, etc. Further, the diode 32 is installed on an upper surface of the metal plate 43 such that there is continuity between the cathode and the metal plate 43 via an electrically conductive bonding material (not illustrated) such as a tin-based solder, etc. The IGBT 20 and the diode 32 are arranged in the longitudinal direction (Y direction) of the metal plate 43.

Thickness of the metal plate 41 at regions where the IGBT 10 and the diode 31 are installed (i.e., thickness of part of the metal plate 41 except for the high-voltage side power supply terminal 41a and the suspending lead terminal 41b) may be about 2 through 3 mm, for example. Thickness of the metal plate 43 at regions where the IGBT 20 and the diode 32 are installed (i.e., thickness of part of the metal plate 43 except for the output terminal 43a and the suspending lead terminal 43b) may be about 2 through 3 mm, for example. The thickness of the parts of the metal plate 41 on which the IGBT 10 and the diode 31 are installed may be substantially the same as that of the parts of the metal plate 43 on which the IGBT 20 and the diode 32 are installed.

The thickness of the high-voltage side power supply terminal 41a and the suspending lead terminal 41b may be less than the thickness of the parts of the metal plate 41 on which the IGBT 10 and the diode 31 are installed. The thickness of the high-voltage side power supply terminal 41a and the suspending lead terminal 41b may be about 0.5 mm, for example. The thickness of the output terminal 43a and the suspending lead terminal 43b may be less than the thickness of the parts of the metal plate 43 on which the IGBT 20 and the diode 32 are installed. The thickness of the output terminal 43a and the suspending lead terminal 43b may be about 0.5 mm, for example.

The metal plate 44 is provided on the IGBT 10 and the diode 31 such that there is continuity between the emitter electrode 12 of the IGBT 10 and the metal plate 44 and between the anode electrode of the diode 31 and the metal plate 44 via an electrically conductive spacer 61 and an electrically conductive bonding material (not illustrated) such as a tin-based solder, etc. The metal plate 44 is electrically connected to the metal plate 43 via an electrically conductive bonding material (not illustrated) such as a tin-based solder, etc.

The metal plate 45 is provided on the IGBT 20 and the diode 32 such that there is continuity between the emitter electrode 22 of the IGBT 20 and the metal plate 45 and between the anode electrode of the diode 32 and the metal plate 45 via an electrically conductive spacer 62 and an electrically conductive bonding material (not illustrated) such as a tin-based solder, etc. The metal plate 45 is electrically connected to the metal plate 42 via an electrically conductive bonding material (not illustrated) such as a tin-based solder, etc. It is noted that a side of the metal plate 42 to which the emitter electrode 22 is connected is also referred to as a "N-side".

The thickness of the metal plate 44 may be about 2 to 3 mm, for example. The thickness of the metal plate 45 may be about 2 to 3 mm, for example. The metal plate 44 and the metal plate 45 may have substantially the same thickness. The metal plate 44 and the metal plate 45 may be formed of copper (Cu), nickel (Ni), aluminum (Al), etc., for example. Surfaces of the metal plate 44 and 45 may be plated with silver (Ag), gold (Au), etc.

The metal lead terminals that form the control electrode terminals 46 are electrically connected to electrodes 19 of the IGBT 10 via a bonding wire. The electrodes 19 are electrically connected to the gate electrode 13 of the IGBT 10, a temperature sensor (not illustrated), etc. The metal lead terminals that form the control electrode terminals 47 are electrically connected to electrodes 29 of the IGBT 20 via a bonding wire. The electrodes 29 are electrically connected to the gate electrode 23 of the IGBT 20, a temperature sensor (not illustrated), etc. The thickness of the metal lead terminals that form the control electrode terminals 46 and 47 may be about 0.5 mm, for example. Metal wires such as a gold wire, a copper wire, etc., can be used to form the bonding wires.

The IGBTs 10 and 20, the diodes 31 and 32, the metal plates 41 through 45, the control electrode terminals 46 and 47, and the bonding wires are sealed by a sealing resin 50. However, at least part of the lower surface of the metal plate 41 and at least part of the lower surface of the metal plate 43 are exposed from the lower surface of the sealing resin 50. Further, at least part of the upper surface of the metal plate 44 and at least part of the upper surface of the metal plate 45 are exposed from the upper surface of the sealing resin 50.

Further, at least part of the high-voltage side power supply terminal 41a of the metal plate 41, at least part of the low-voltage side power supply terminal 42a of the metal plate 42, and at least part of the output terminal 43a of the metal plate 43 project from the front surface of the sealing resin 50. Further, at least part of the suspending lead terminal 41b that is formed at an end of the metal plate 41, at least part of the suspending lead terminal 43b that is formed at an end of the metal plate 43, at least part of the control electrode terminals 46, and at least part of the control electrode terminals 47 project from the back surface of the sealing resin 50.

A first direction (substantially corresponding to X direction) in which the IGBTs 10 and 20 are arranged and a second direction (substantially corresponding to Y direction) in which the suspending lead terminals 41b and 43b and the control electrode terminals 46 and 47 project are perpendicular to each other. It is noted that, in the present application, being perpendicular does not means being perfectly perpendicular but being roughly perpendicular. For example, being perpendicular includes a state in which an angle between the first direction and the second direction is shifted from 90 degrees by 10 and few degrees due to variations, etc., in the production.

The sealing resin 50 may be formed from an epoxy-based resin having a filler therein, for example. The thickness of the sealing resin 50 may be about 5 mm, for example.

Parts of the metal plates 41 through 45 that are exposed from the sealing resin 50 can contribute to radiation of the heat, which is generated by the IGBTs 10 and 20, etc., to the outside. The metal plates 41 through 45 may be formed of lead frames, for example. The suspending lead terminals 41b and 43b are initially connected to a body (not illustrated) of the lead frames when the metal plate 41 and the metal plate 43 are formed from the lead frames, but are cut away from the body (not illustrated) of the lead frames after the sealing is implemented with the sealing resin 50.

A concave portion 51, which is recessed from the back surface in a direction toward a side of the IGBT 10 opposed to the back surface in a plane view, is provided between the terminals (the suspending lead terminal 41b and the control electrode terminals 46) that project from the back surface. A concave portion 52, which is recessed from the back surface in a direction toward a side of the IGBT 20 opposed to the back surface in a plane view, is provided in the sealing resin 50 between the terminals (the suspending lead terminal 41b and the control electrode terminals 47) that project from the back surface.

In a plane view, the side of the concave portion 51, which is on the side of the IGBT 10, has such a rounded shape that has a convex on the side of the IGBT 10. In a plane view, the side of the concave portion 52, which is on the side of the IGBT 20, has such a rounded shape that has a convex on the side of the IGBT 20.

Because the concave portion 52 is provided between the terminals (the suspending lead terminal 41b and the control electrode terminals 47) that project from the back surface, the creepage distance between the neighboring terminals is increased, which improves insulation characteristics, without increasing a size of the semiconductor apparatus. Because the concave portion 52 is provided between the terminals (the suspending lead terminal 43b and the control electrode terminals 47) that project from the back surface, the creepage distance between the neighboring terminals is increased, which improves insulation characteristics, without increasing the size of the semiconductor apparatus.

The concave portion 51 is formed in the back surface in a direction toward a side of the IGBT 10 opposed to the back surface because the region in which the concave portion 51 is formed is not easily influenced by an increase of the temperature of the IGBT 10 (the increase of the temperature is small in the region). In other words, as illustrated in FIG. 6, a heating area (element active region) of the IGBT 10 corresponds to a part that contacts with the spacer 61, and the heat generated at the heating area is transferred to the outside via regions H of the metal plates 41 and 44 that are hatched with a satin pattern. In other words, the increase of the temperature is great in the regions H.

On the other hand, the increase of the temperature is small in regions I of the metal plates 41 and 44 because the regions I are away from the heating area of the IGBT 10. By providing the concave portion 51 in the region in which the increase of the temperature is small, it becomes possible to reduce the stress due to the difference in coefficients of thermal expansion between the metal plates 41 and 44 and the sealing resin 50. Similarly, because the concave portion 52 is provided in the region which is away from the heating area of the IGBT 20 and thus has a small increase of the temperature, it becomes possible to reduce the stress due to the difference in coefficients of thermal expansion between the metal plates 43 and 45 and the sealing resin 50.

It is noted that the longer a distance d (see FIG. 6) from end surfaces of the metal plates 41 and 44 on the side of the concave portion 51 to the deepest portion (that is closest to the metal plates 41 and 44) becomes, the lesser the influence of the increase of the temperature becomes, and thus the lesser the stress due to the difference in coefficients of thermal expansion between the metal plates 41 and 44 and the sealing resin 50 becomes. This holds true for the concave portion 52. Further, the concave portion 51 includes the rounded shape because this enables further reducing the stress due to the difference in coefficients of thermal expansion between the metal plates 41 and 44 and the sealing resin 50. This holds true for the concave portion 52. This is described hereinafter with reference to FIG. 7.

The width (X direction) of the concave portions 51 and 52 may be about 1 through 3 mm, for example. The maximum of the recessed amount (Y direction) of the concave portions 51 and 52 may be about 3 through 6 mm, for example. It is noted that, in the present application, "plane view" means viewing from Z direction (perpendicular to a plane in which the semiconductor elements are arranged) in FIG. 2, etc.

According to the embodiment, the longitudinal direction of the concave portions 51 and 52 substantially corresponds to the longitudinal direction of the metal plates 41 through 43 (Y direction) and the metal lead terminals that form the control electrode terminals 46 and 47.

Here, particular effects due to the concave portions 51 and 52 of the sealing resin 50 are explained. At first is explained, the effect that the stress due to the heat generated by the IGBT (due to the difference in coefficients of thermal expansion between the metal plates and the sealing resin) is reduced.

When the IGBT generates heat, the heat is transmitted to the metal plates, which causes the metal plates to expand. The heat of the IGBT is transmitted to the sealing resin; however, the coefficient of thermal expansion of the sealing resin is smaller than that of the metal plates, and thus the expansion amount of the sealing resin is smaller than that of the metal plates under the same temperature. Such a difference in coefficients of thermal expansion between the metal plates and the sealing resin causes the stress in the sealing resin, and such a stress tends to concentrate at the concave portion. The stress concentration at the concave portion can induce a crack near the concave portion of the sealing resin.

Figure 8:
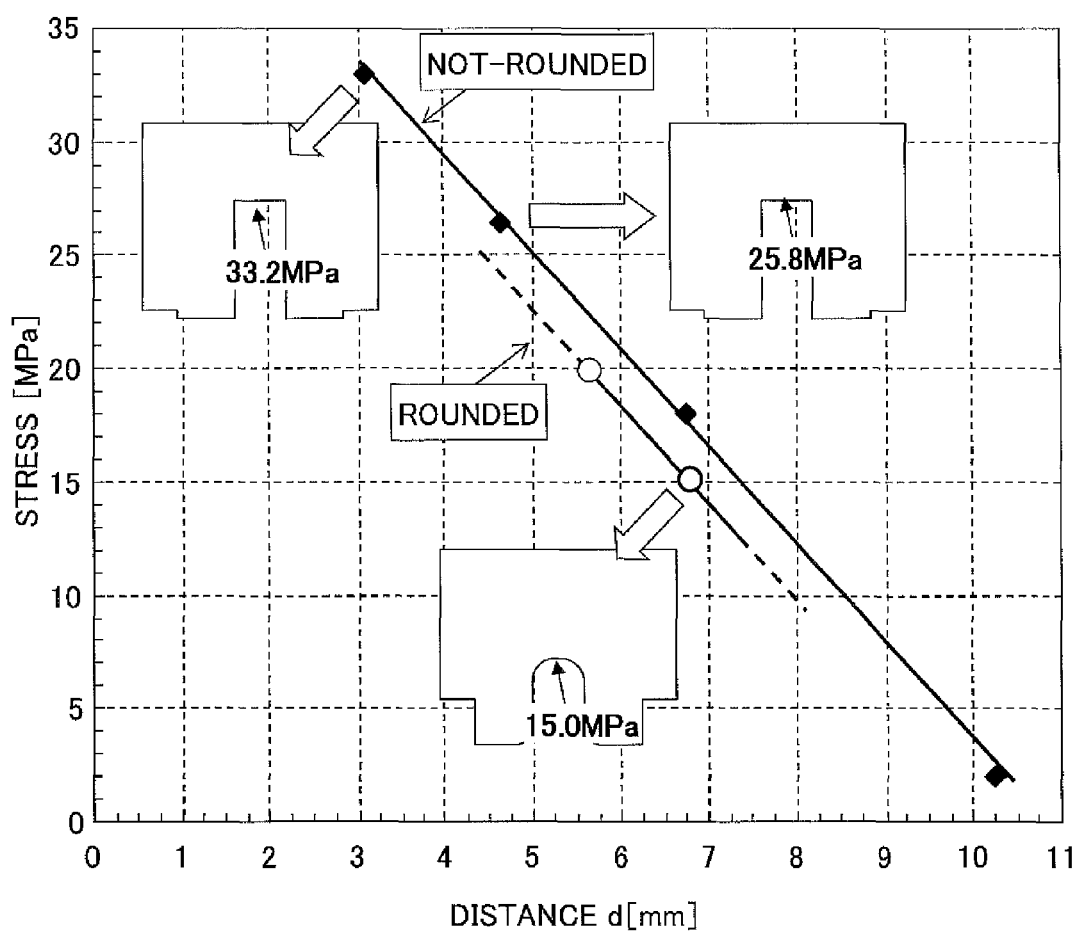
FIG. 8 is a graph illustrating an example of a simulation result of a relationship between a distance d from an end surface of a metal plate to a deepest portion of a concave portion and a stress at the concave portion.

As described above, the concave portion 51 is provided in such a region in which the stress due to the heat of the IGBT 10 is small, and thus the stress concentration is reduced to a degree. However, in a plane view, the side of the concave portion 51 on the side of the IGBT 10 is rounded such that the convexity formed thereby faces the side of the IGBT 10, which enables distributing the stress and thus further reducing the stress, as illustrated in FIG. 8. This also holds true for the concave portion 52.

FIG. 8 is a diagram illustrating an example of a simulation result of a relationship between the distance d (see FIG. 6) from the end surfaces of the metal plates to the deepest portion of the concave portion and the stress (maximum stress) at the concave portion. As illustrated in FIG. 8, the increased distance d can reduce the stress regardless of the rounded shape. Further, under the same distance d, the rounded shape of the concave portion on the side of the IGBT can further reduce the stress by about 15 through 20%. In this way, by providing the concave portion in the region where the stress due to the heat of the IGBT is small, and forming the concave portion with the rounded shape on the side of the IGBT, the stress can be greatly reduced.

It is noted that, in the embodiment, the side of the concave portion 51 on the side of the IGBT 10 and the side of the concave portion 52 on the side of the IGBT 20 are curved along the length such that these sides don't include a straight portion. The sides of the concave portions on the sides of the IGBTs may include a straight portion; however, the increased radius of the rounded shape can distribute the stress more, which enables easily reducing the stress due to the difference in coefficients of thermal expansion between the metal plate and the sealing resin.

Figure 9:
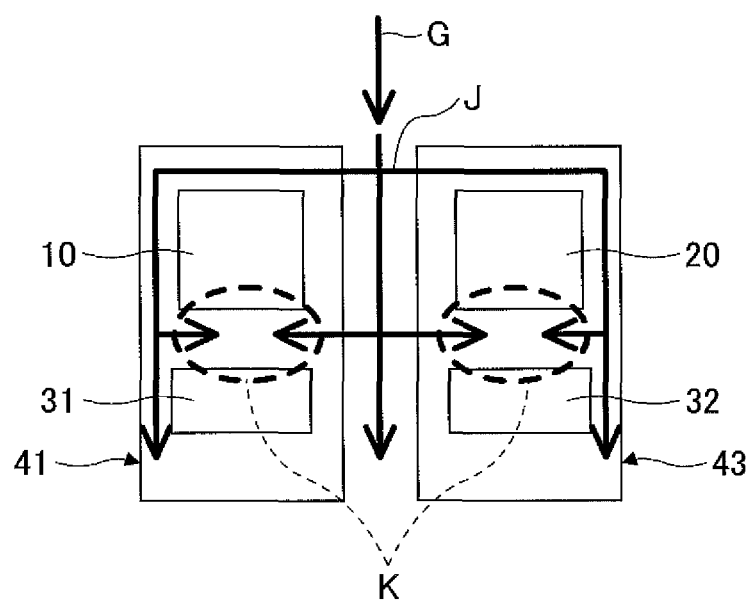
FIG. 9 is a plane view of a comparative embodiment for explaining a flow of a resin according to an ordinary process.

Next is explained, the effect that a flow of the resin for forming the sealing resin 50 is improved. FIG. 9 is a plane view of a comparative embodiment for explaining a flow of a resin according to an ordinary process. In FIG. 9, the illustration of the lead terminals and the bonding wires is omitted, and the metal plates are illustrated with simplified shapes. As is the case with FIG. 7, etc., in FIG. 9, the upper side (on the side of the gate G) corresponds to the back side in which the lead terminals project. It is noted that the gate G is a resin injection inlet for injecting the resin that forms the sealing resin 50.

As illustrated in FIG. 9, with respect to the semiconductor apparatus in which the IGBTs 10 and 20 and the diodes 31 and 32 are arranged in the lateral and longitudinal directions, it is assumed that the resin is injected from the gate G that is disposed at a center portion between the IGBT 10 and the IGBT 20 and on the back side in which the lead terminals project. In this case, the resin flowed is as indicated by an arrow J in FIG. 9.

In other words, flows of the resin injected from the gate G include a flow from the center portion between the IGBT 10 and the IGBT 20 and flows from the outsides of the IGBT 10 and the IGBT 20. The flows join into one between the IGBT 10 and the diode 31 and between the IGBT 20 and the diode 32. In other words, a portion between the IGBT 10 and the diode 31 and a portion between the IGBT 20 and the diode 32 define confluences K (weld lines).

At the confluences K (weld lines), voids and exfoliation between the resin and the metal plate, etc., easily occur. In particular, in the case of a double-sided heat radiation construction in which the semiconductor elements such as IGBTs, diodes, etc., are sandwiched between the metal plates in the up-and-down direction, air in space between the semiconductor elements cannot be evacuated, which easily causes such a problem.

Further, such a configuration is contemplated in which the gate G is provided on the front side opposite to the configuration illustrated in FIG. 9; however, in such a configuration, the confluences (weld lines) are located near the bonding wires, which may cause the bonding wires to fall down. Thus, such a configuration is not desirable.

On the other hand, according to the embodiment, as illustrated in FIG. 7, the gate G (resin injection inlet) is provided at a corner portion that is formed such that the corner portion includes a part of the back surface. In this case, the resin flows as illustrated in FIG. 10.

Figure 10:
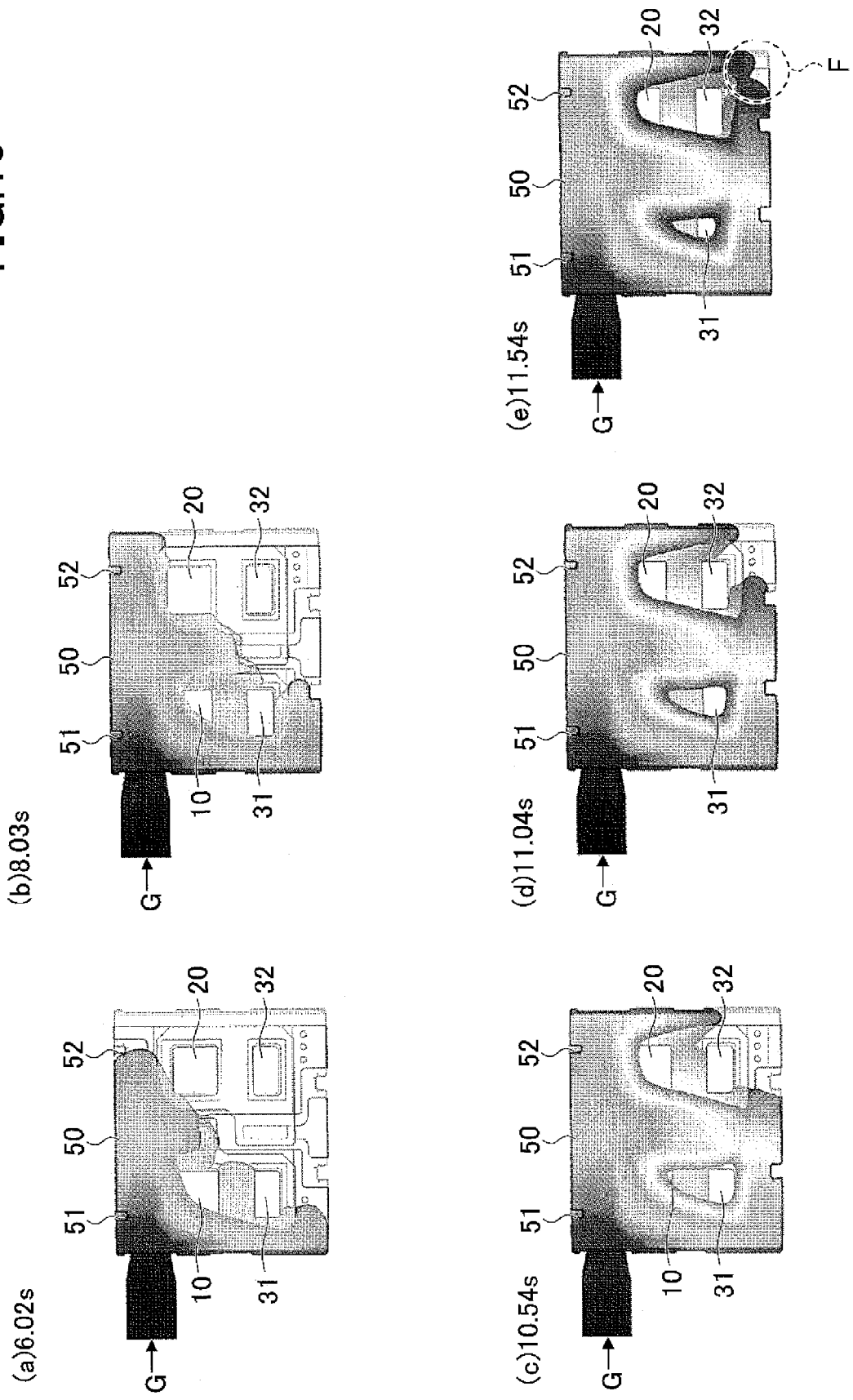
FIG. 10 is a diagram illustrating an example of a result of a resin flow analysis for injecting a dissolved resin into a die to perform a resin molding process in a production process of the semiconductor apparatus according to the first embodiment.

FIG. 10 is a diagram illustrating an example of a result of a resin flow analysis for injecting a dissolved resin into a die to perform a resin molding process in a production process of the semiconductor apparatus according to the first embodiment. The resin injected from the gate G, as illustrated in FIG. 10(a), flows uniformly from the corner portion where the gate G is provided, and toward a corner portion that is diagonally opposite to the gate G, as illustrated in FIG. 10(b) through (d). Then, as illustrated in FIG. 10(e), the corner portion that is diagonally opposite to the gate G becomes a resultant confluence F (weld line). It is noted that the position of the gate and the position of the weld line can be confirmed after the resin has been cured.

The confluence F has no obstacle such as a wall or the like that prevents the air from being evacuated, which enables pushing out the air to the outside and thus reducing the involvement of the air. Accordingly, it becomes possible to reduce the voids and the exfoliation between the resin and the metal plate, and thus the semiconductor apparatus 1 with high durability and reliability can be obtained.

In other words, in order to obtain the effect described above without considering the position of the gate G, flow rate control of the resin needs to be performed in any manner because the concave portion 51 and the concave portion 52 with the rounded shapes don't have a function of contributing to the flow rate control of the resin (it is necessary to form a special concave shape in order to perform the flow control). According to the embodiment, by providing the gate G (resin injection inlet) at the corner portion that is formed such that the corner portion includes a part of the back surface, the effect described above can be obtained without providing such a concave portion that has a special concave shape.

It is noted that, in the example illustrated in FIG. 7, the gate G is provided on the side of the corner portion on the side of the concave portion 51; however, the gate G may be provided on the side of the corner portion on the side of the concave portion 52. Alternatively, the gate G may be provided on the back side of the corner portion on the side of the concave portion 51; however, the gate G may be provided on the back side of the corner portion on the side of the concave portion 52. In any case, the resin flows from the first corner portion including the back surface of the sealing resin to the second corner portion that is diagonally opposite to the first corner portion, and thus the portion between the IGBT and the diode does not define the confluence (weld lines), which enables reducing the involvement of the air. For this reason, the same effect as described above with reference to FIG. 10 can be obtained.

In this way, according to the first embodiment, the concave portion, which is recessed toward the side of the semiconductor element from the back surface of the sealing resin, is provided between the terminals that project from the back surfaces of the sealing resin. With this arrangement, the creepage distance between the neighboring terminals can be increased, which improves insulation characteristics, without increasing a size of the semiconductor apparatus.

Further, by providing the concave portion in the region (from the back side of the sealing resin to the side of the semiconductor element opposed to the back side) which are not easily influenced by the increase of the temperature of the semiconductor element, it becomes possible to reduce the stress due to the difference in coefficients of thermal expansion between the metal plate and the sealing resin. Further, the rounded shape of the concave portion on the side of the semiconductor element can distribute the stress, which enables further reducing the stress due to the difference in coefficients of thermal expansion between the metal plate and the sealing resin. As a result, it becomes possible to prevent the cracking of the sealing resin due to the stress.

Further, by providing the gate (resin injection inlet) at the corner portion that is formed such that the corner portion includes a part of the back surface from which the lead terminals project, it becomes possible to reduce the involvement of the air, because the resin flows from the first corner portion including the back surface to the second corner portion that is diagonally opposite to the first corner portion. Accordingly, it becomes possible to reduce the voids and the exfoliation between the resin and the metal plates, and thus the semiconductor apparatus 1 with high durability and reliability can be obtained.

Further, by injecting the resin from the back side (on the side of the bonding wires) from which the lead terminals project, it becomes possible to reduce the likelihood that the bonding wires fall down, because the portion including the bonding wires does not define the confluence (weld line).

In the following, variants of the first embodiment are described. In the variants, an explanation for components which are the same as those in the embodiment described above is omitted.

[First Variant of the First Embodiment]

Figure 11:
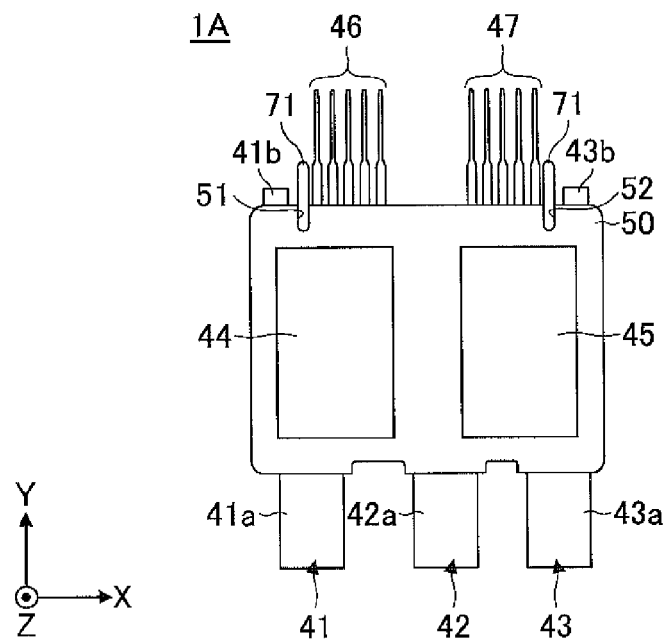
FIG. 11 is a plane view illustrating an example of the semiconductor apparatus according to a first variant of the first embodiment.

FIG. 11 is a plane view illustrating an example of the semiconductor apparatus according to a first variant of the first embodiment. Referring to FIG. 11, a semiconductor apparatus 1A differs from the semiconductor apparatus 1 (see FIG. 3, etc.) in that the semiconductor apparatus 1A has insulation elements 71 within the concave portions 51 and 52, respectively. Ends of the insulation elements 71 project from the back surface of the sealing resin 50 in the same direction (Y direction) as the suspending lead terminal 41b, the control electrode terminals 46, etc.

The insulation elements 71 are formed of insulation material that is harder than the sealing resin 50. The insulation elements 71 may be formed from an epoxy-based resin having a filler therein, for example, as the sealing resin 50. In this case, if the amount of the filler included in the insulation elements 71 is greater than the mount of the filler included in the sealing resin 50, the insulation elements 71 can be harder than the sealing resin 50. Of course, the material of the insulation elements 71 may differ from that of the sealing resin 50.

It is noted that the insulation elements 71 may have any length as long as the concave portion 51 and the concave portion 52 are filled with the insulation elements 71. The excessive portions of the insulation elements 71 that are exposed from the concave portion 51 and the concave portion 52 can be absorbed on a side of a substrate by forming the excessive portions such that the excessive portions can be received by the substrate on which the semiconductor apparatus 1A is installed.

According to the first variant of the first embodiment, the following effects can be obtained in addition to the effects according to the first embodiment. In other word, by inserting the insulation elements, which are harder than the sealing resin, in the concave portions, it becomes possible to suppress the deformation of the sealing resin, because the deformation of the sealing resin can be limited by the insulation elements. Further, by forming the insulation elements such that the insulation elements project from the back side of the sealing resin in the same direction as the terminals, the creepage distance between the neighboring terminals can be increased, which improves insulation characteristics, without increasing the size of the semiconductor apparatus. Further, the portions of the insulation elements that project from the back side of the sealing resin can be used for the registration of the semiconductor apparatus.

[Second Variant of the First Embodiment]

Figure 12:
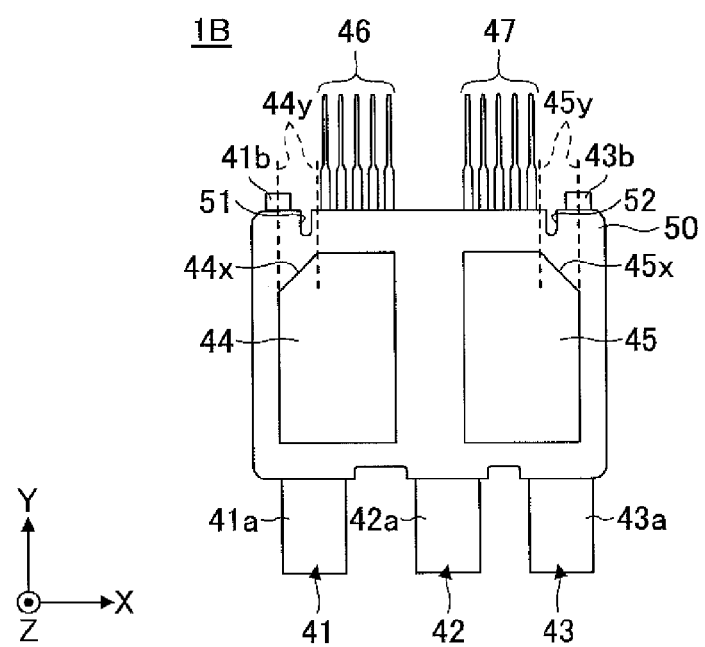
FIG. 12 is a plane view illustrating an example of the semiconductor apparatus according to a second variant of the first embodiment.

FIG. 12 is a plane view illustrating an example of the semiconductor apparatus according to a second variant of the first embodiment. Referring to FIG. 12, the semiconductor apparatus 1B differs from the semiconductor apparatus 1 (see FIG. 3, etc.) in that a notch $44x$ is provided in the metal plate 44 and a notch $45x$ is provided in the metal plate 45. The notch $44x$ is provided in the metal plate 44 at a corner on the back side and the left side of the sealing resin 50. The notch $45x$ is provided in the metal plate 45 at a corner on the back side and the right side of the sealing resin 50.

The concave portion 51 is provided at a location that corresponds to the notch $44x$, and the concave portion 52 is provided at a location that corresponds to the notch $45x$. It is noted that "location that corresponds to the notch $44x$" means a region between two dotted lines $44y$ extending in Y direction from the opposite ends of the notch $44x$ in X direction. Similarly, "location that corresponds to the notch $45x$" means a region between two dotted lines $45y$ extending in Y direction from the opposite ends of the notch $45x$ in X direction.

According to the second variant of the first embodiment, the following effects can be obtained in addition to the effects according to the first embodiment. In other words, by providing the notch at the corner of the metal plate that is disposed on the semiconductor element and on the back side of the sealing resin, and providing the concave portion at the location that corresponds to the notch, it becomes possible to increase the distance between the heating area of the semiconductor element and the concave portion with respect to the first embodiment. Thus, the stress due to the difference in coefficients of thermal expansion between the metal plate and the sealing resin can be further reduced with respect to the first embodiment.

It is noted that the notch may be formed at the corner of the metal plate such that the notch extends at an angle of 45 degrees with respect to Y direction, for example; however, the angle may be arbitrary. Further, because a technical meaning is to increase the distance between the heating area of the semiconductor element and the concave portion, the shape of the notch may not be straight such as a curved or a rectangular notch. Alternatively, the notch may have a more complicated shape such a stepped shape, etc.

[Third Variant of the First Embodiment]

Figure 13:
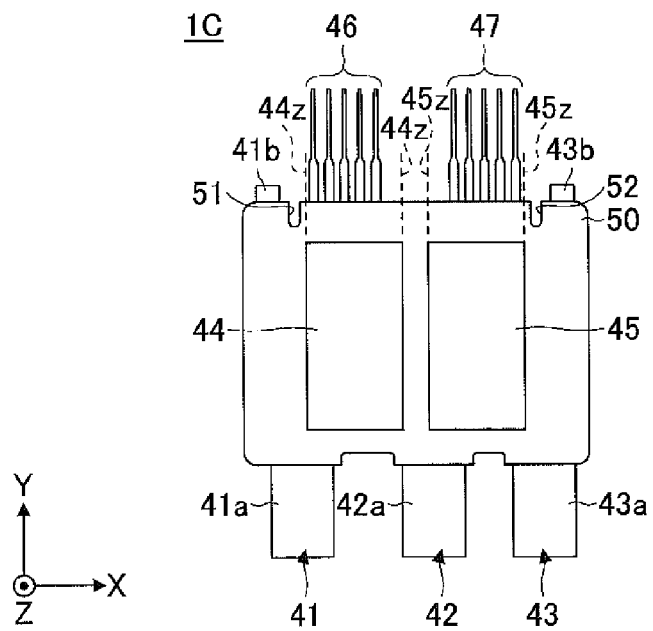
FIG. 13 is a plane view illustrating an example of the semiconductor apparatus according to a third variant of the first embodiment.

FIG. 13 is a plane view illustrating an example of the semiconductor apparatus according to a third variant of the first embodiment. Referring to FIG. 13, the semiconductor apparatus 1C differs from the semiconductor apparatus 1 (see FIG. 3, etc.) in a positional relationship between the concave portion 51 and the metal plate 44 and a positional relationship between the concave portion 52 and the metal plate 45.

According to the semiconductor apparatus 1 (see FIG. 3, etc.), the concave portion 51 is provided at a location that corresponds to the metal plate 44, and the concave portion 52 is provided at a location that corresponds to the metal plate 45. According to the semiconductor apparatus 1C, the concave portion 51 is provided at a location that does not correspond to the metal plate 44, and the concave portion 52 is provided at a location that does not correspond to the metal plate 45.

It is noted that "location that corresponds to the metal plate 44" means a region between two dotted lines $44z$ extending in Y direction from the opposite ends of the side of the metal plate 44 in X direction and on the back side of the sealing resin 50. Further, "location that does not correspond to the metal plate 44" means that the location is outside of the region between two dotted lines $44z$ extending in Y direction from the opposite ends of the side of the metal plate 44 in X direction and on the back side of the sealing resin 50.

Similarly, "location that corresponds to the metal plate 45" means a region between two dotted lines $45z$ extending in Y direction from the opposite ends of the side of the metal plate 45 in X direction and on the back side of the sealing resin 50. Further, "location that does not correspond to the metal plate 45" means that the location is outside of the region between two dotted lines $45z$ extending in Y direction from the opposite ends of the side of the metal plate 45 in X direction and on the back side of the sealing resin 50.

According to the third variant of the first embodiment, the following effects can be obtained in addition to the effects according to the first embodiment. By providing the concave portion at the location that does not correspond to the metal plate, it becomes possible to increase the distance between the heating area of the semiconductor element and the concave portion with respect to the first embodiment. Thus, the stress due to the difference in coefficients of thermal expansion between the metal plate and the sealing resin can be further reduced with respect to the first embodiment.

[Fourth Variant of the First Embodiment]

Figure 14:
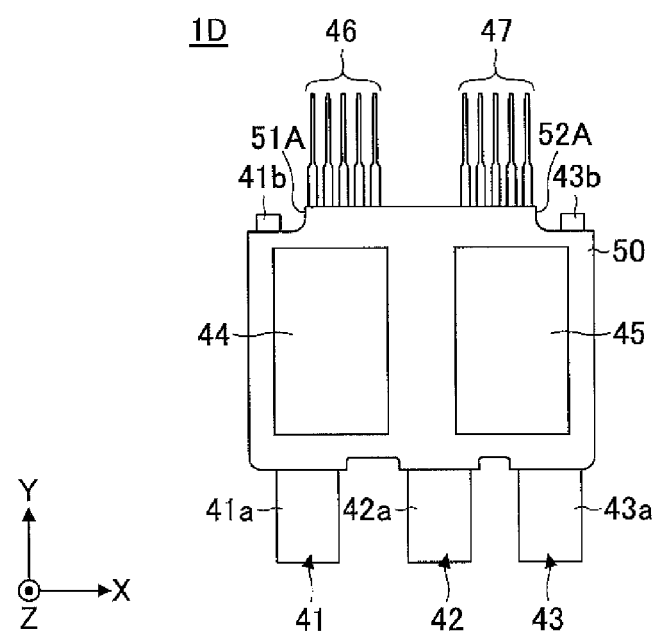
FIG. 14 is a plane view (No. 1) illustrating an example of the semiconductor apparatus according to a fourth variant of the first embodiment.

FIG. 14 is a plane view illustrating an example of the semiconductor apparatus according to a fourth variant of the first embodiment. Referring to FIG. 14, a semiconductor apparatus 1D differs from the semiconductor apparatus 1 (see FIG. 3, etc.) in that the concave portions 51 and 52 are replaced with concave portions 51A and 52A, respectively.

The concave portion 51A, as the concave portion 51, is recessed from the back surface of the sealing resin 50 in a direction toward the side of the IGBT 10 opposed to the back surface in a plane view, and partially includes a rounded shape. However, the concave portion 51A, unlike the concave portion 51, is provided at the left corner on the back side of the sealing resin 50, and, in a plane view, the side of the concave portion 51A on the side of the IGBT 10 is connected to the left side surface of the sealing resin 50.

Further, the concave portion 52A, as the concave portion 52, is recessed from the back surface of the sealing resin 50 in a direction toward the side of the IGBT 20 opposed to the back surface in a plane view, and partially includes a rounded shape. However, the concave portion 52A, unlike the concave portion 52, is provided at the right corner on the back side of the sealing resin 50, and, in a plane view, the side of the concave portion 52A on the side of the IGBT 20 is connected to the right side surface of the sealing resin 50.

Figure 15:
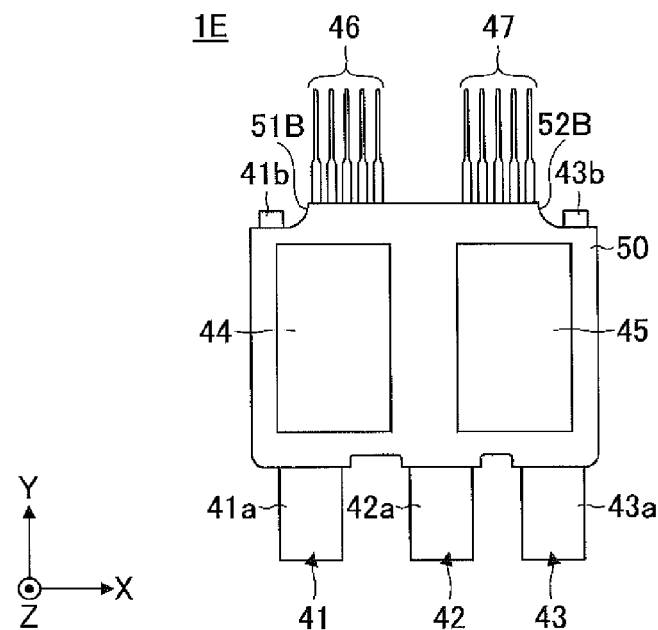
FIG. 15 is a plane view (No. 2) illustrating an example of the semiconductor apparatus according to the fourth variant of the first embodiment.

As the fourth variant of the first embodiment, even by providing the concave portion that has such a relatively large shape that is connected to the side surface of the sealing resin, the same effect as the first embodiment can be obtained. It is noted that, as the concave portions 51B and 52B of the semiconductor apparatus 1E illustrated in FIG. 15, by making the radius of the rounded shape greater than the concave portions 51B and 52B, the stress due to the difference in coefficients of thermal expansion between the metal plate and the sealing resin can be further reduced.

[Fifth Variant of the First Embodiment]

Figure 16:
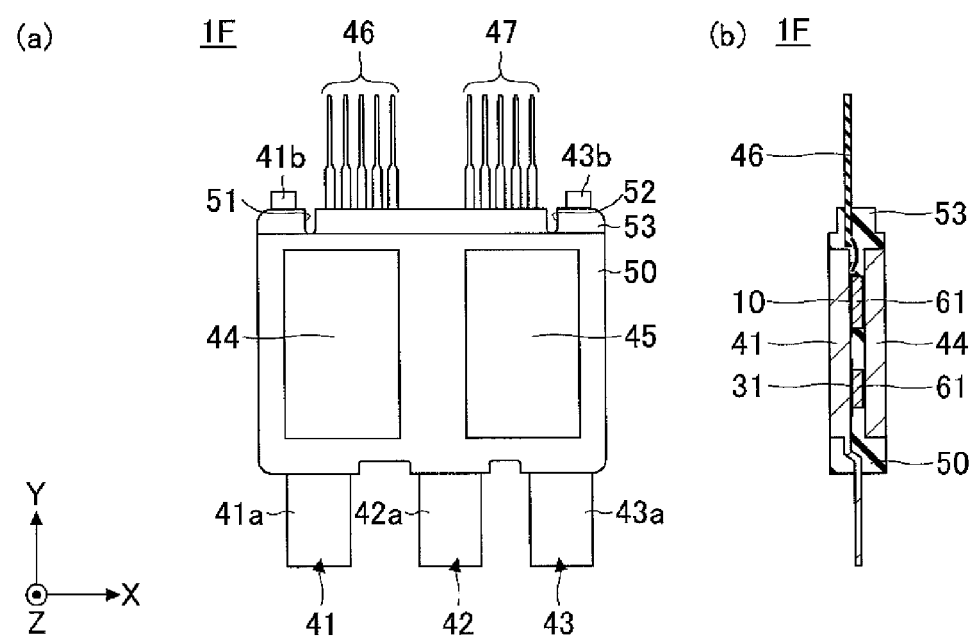
FIG. 16 is a plane view illustrating an example of the semiconductor apparatus according to a fifth variant of the first embodiment.

FIG. 16 is a plane view illustrating an example of the semiconductor apparatus according to a fifth variant of the first embodiment. In FIG. 16,(a) is a plane view, and (b) is a cross-sectional view in YZ plane of (a). Referring to FIG. 16, the semiconductor apparatus 1F differs from the semiconductor apparatus 1 (see FIG. 3, etc.) in that the semiconductor apparatus 1F includes a step portion 53 that is provided on the back side of the sealing resin 50. The step portion 53 may be provided on upper and lower sides of the semiconductor apparatus 1F. Specifically, an upper surface of the step portion 53 is located at a level that is lower than the upper surface of the sealing resin 50 by a step, and a lower surface of the step portion 53 is located at a level that is higher than the lower surface of the sealing resin 50 by a step.

According to the fifth variant of the first embodiment, the following effects can be obtained in addition to the effects according to the first embodiment. Specifically, by providing the step portion on the back side of the sealing resin, the creepage distance between the neighboring terminals can be further increased without increasing a size of the semiconductor apparatus, with respect to the first embodiment. As a result, the insulation characteristics can be further improved with respect to the first embodiment.

[Sixth Variant of the First Embodiment]

Figure 17:
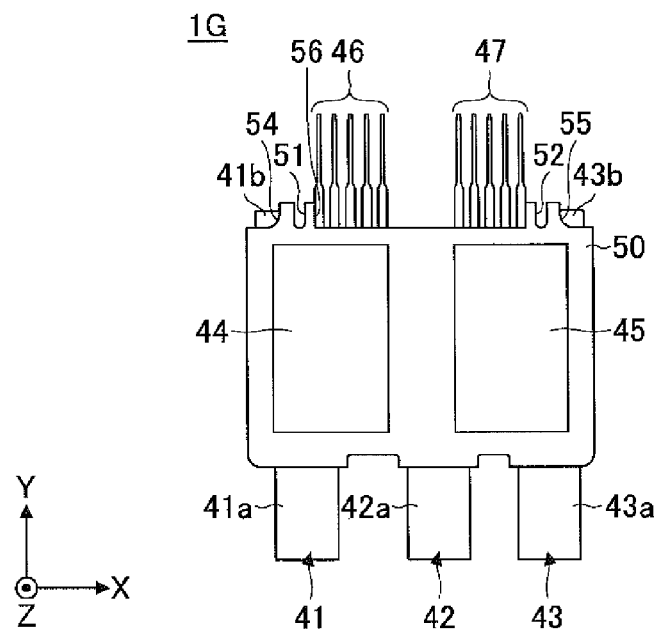
FIG. 17 is a plane view illustrating an example of the semiconductor apparatus according to a sixth variant of the first embodiment.

FIG. 17 is a plane view illustrating an example of the semiconductor apparatus according to a sixth variant of the first embodiment. Referring to FIG. 17, the semiconductor apparatus 1G differs from the semiconductor apparatus 1 (see FIG. 3, etc.) in that the semiconductor apparatus 1G additionally includes concave portions 54, 55 and 56 that are provided on the back surface of the sealing resin 50.

The concave portion 54 is provided at the left corner on the back side of the sealing resin 50, and, in a plane view, the side of the concave portion 54 on the side of the IGBT 10 is connected to the left side surface of the sealing resin 50. The concave portion 55 is provided at the right corner on the back side of the sealing resin 50, and, in a plane view, the side of the concave portion 54 on the side of the IGBT 20 is connected to the right side surface of the sealing resin 50.

The concave portion 56 is provided in a center portion of the back surface of the sealing resin 50 and in a region in which the control electrode terminals 46 and 47 are provided. Inner side surfaces of the concave portion 56 contact corresponding outer surfaces of the outermost terminals of the control electrode terminals 46 and 47.

According to the sixth variant of the first embodiment, the following effects can be obtained in addition to the effects according to the first embodiment. Specifically, by further providing the concave portion on the back side of the sealing resin, the creepage distance between the neighboring terminals can be further increased without increasing a size of the semiconductor apparatus, with respect to the first embodiment. As a result, the insulation characteristics can be further improved with respect to the first embodiment.

[Seventh Variant of the First Embodiment]

Figure 18:
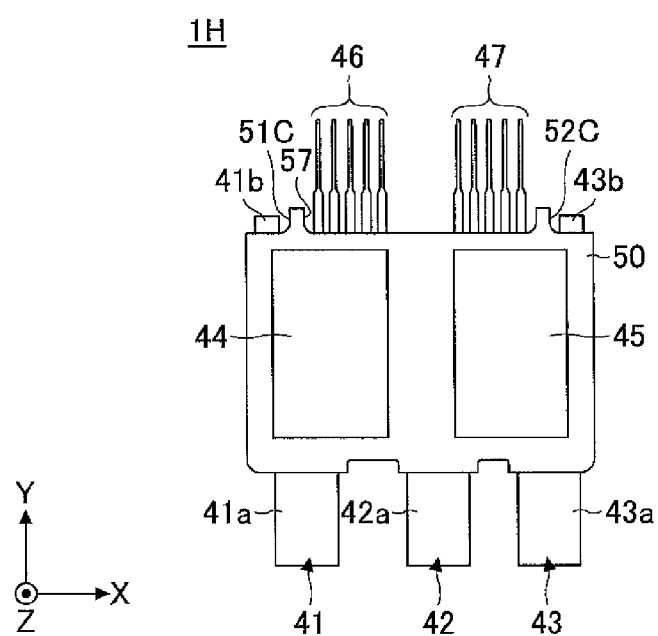
FIG. 18 is a plane view illustrating an example of the semiconductor apparatus according to a seventh variant of the first embodiment.

FIG. 18 is a plane view illustrating an example of the semiconductor apparatus according to a seventh variant of the first embodiment. Referring to FIG. 18, the semiconductor apparatus 1H differs from the semiconductor apparatus 1 (see FIG. 3, etc.) in that the concave portions 51 and 52 are replaced with concave portions 51C and 52C, respectively, and the semiconductor apparatus 1H additionally includes a concave portion 57 that is provided in a center portion of the back surface of the sealing resin 50 and in a region in which the control electrode terminals 46 and 47 are provided.

The concave portion 51C, as the concave portion 51, is recessed from the back surface of the sealing resin 50 in the direction toward the side of the IGBT 10 opposed to the back surface in a plane view, and partially includes a rounded shape. However, the concave portion 51C, unlike the sealing resin 50, is provided at the left corner on the back side of the sealing resin 50, and, in a plane view, the side of the concave portion 51C on the side of the IGBT 10 is connected to the left side surface of the sealing resin 50.

Further, the concave portion 52C, as the concave portion 52, is recessed from the back surface of the sealing resin 50 in a direction toward the side of the IGBT 20 opposed to the back surface in a plane view, and partially includes a rounded shape. However, the concave portion 52C, unlike the concave portion 52, is provided at the right corner on the back side of the sealing resin 50, and, in a plane view, the side of the concave portion 52C on the side of the IGBT 20 is connected to the right side surface of the sealing resin 50.

According to the seventh variant of the first embodiment, the following effects can be obtained in addition to the effects according to the first embodiment. Specifically, by further providing the concave portion on the back side of the sealing resin, the creepage distance between the neighboring terminals can be further increased without increasing a size of the semiconductor apparatus, with respect to the first embodiment. As a result, the insulation characteristics can be further improved with respect to the first embodiment.

[Eighth Variant of the First Embodiment]

Figure 19:
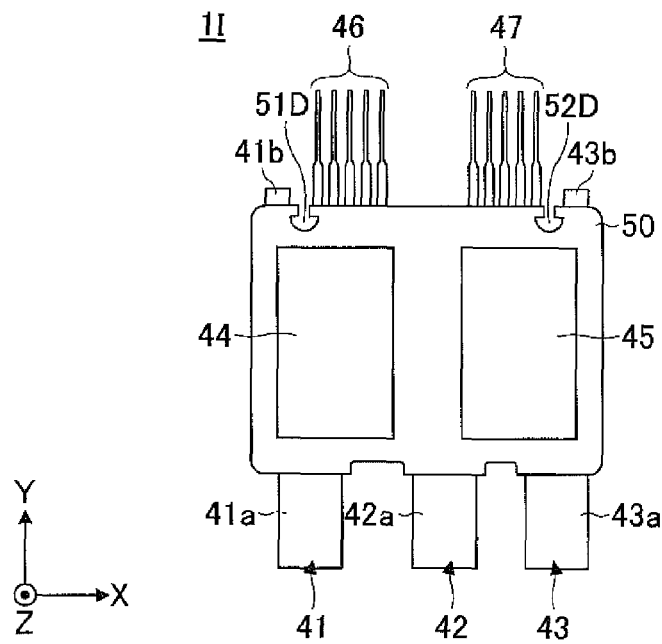
FIG. 19 is a plane view illustrating an example of the semiconductor apparatus according to an eighth variant of the first embodiment.

FIG. 19 is a plane view illustrating an example of the semiconductor apparatus according to an eighth variant of the first embodiment. Referring to FIG. 19, a semiconductor apparatus 1I differs from the semiconductor apparatus 1 (see FIG. 3, etc.) in that the concave portions 51 and 52 are replaced with concave portions 51D and 52D, respectively.

The concave portion 51D, as the concave portion 51, is recessed from the back surface of the sealing resin 50 in a direction toward the side of the IGBT 10 opposed to the back surface in a plane view, and partially includes a rounded shape. However, the concave portion 51D, unlike the concave portion 51, has a wedge-shape whose width is narrow on the back side of the sealing resin 50 and wide on the side of the IGBT 10.

Further, the concave portion 52D, as the concave portion 52, is recessed from the back surface of the sealing resin 50 in the direction toward the side of the IGBT 20 opposed to the back surface in a plane view, and partially includes a rounded shape. However, the concave portion 52D, unlike the concave portion 52, has a wedge-shape whose width is narrow on the back side of the sealing resin 50 and wide on the side of the IGBT 20.

As the eighth variant of the first embodiment, by forming the concave portion with the wedge-shape, the creepage distance between the neighboring terminals can be further increased without increasing a size of the semiconductor apparatus, with respect to the first embodiment. As a result, the insulation characteristics can be further improved with respect to the first embodiment.

[Ninth Variant of the First Embodiment]

Figure 20:
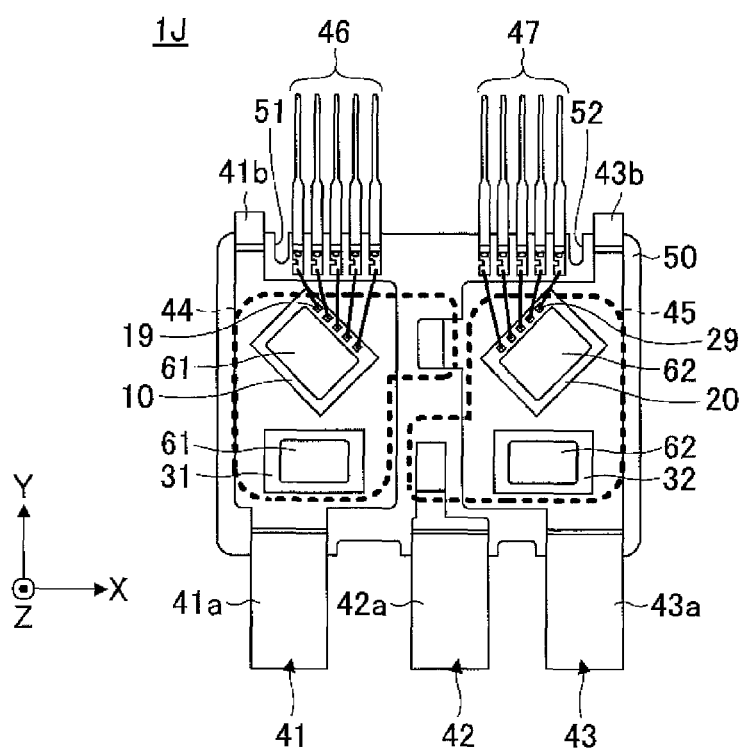
FIG. 20 is a plane view illustrating an example of the semiconductor apparatus according to a ninth variant of the first embodiment.

FIG. 20 is a plane view illustrating an example of the semiconductor apparatus according to a ninth variant of the first embodiment. Referring to FIG. 20, a semiconductor apparatus 1J differs from the semiconductor apparatus 1 (see FIG. 3, etc.) in that the IGBTs 10 and 20 are installed such that the IGBTs 10 and 20 are inclined with respect to the back surface of sealing resin 50.

According to the ninth variant of the first embodiment, the following effects can be obtained in addition to the effects according to the first embodiment. In other words, by installing the IGBTs 10 and 20 such that the IGBTs 10 and 20 are inclined with respect to the back surface of sealing resin 50, it becomes possible to increase the distance between the heating area of the semiconductor element and the concave portion with respect to the first embodiment. Thus, the stress due to the difference in coefficients of thermal expansion between the metal plate and the sealing resin can be further reduced with respect to the first embodiment.

It is noted that the IGBTs 10 and 20 can be installed such that the IGBTs 10 and 20 are inclined with an angle of 45 degrees with respect to the back surface of sealing resin 50 (X direction); however, the angle may be arbitrary as long as the distance between the heating area of the semiconductor element and the concave portion can be increased.

[Tenth Variant of the First Embodiment]

Figure 21:
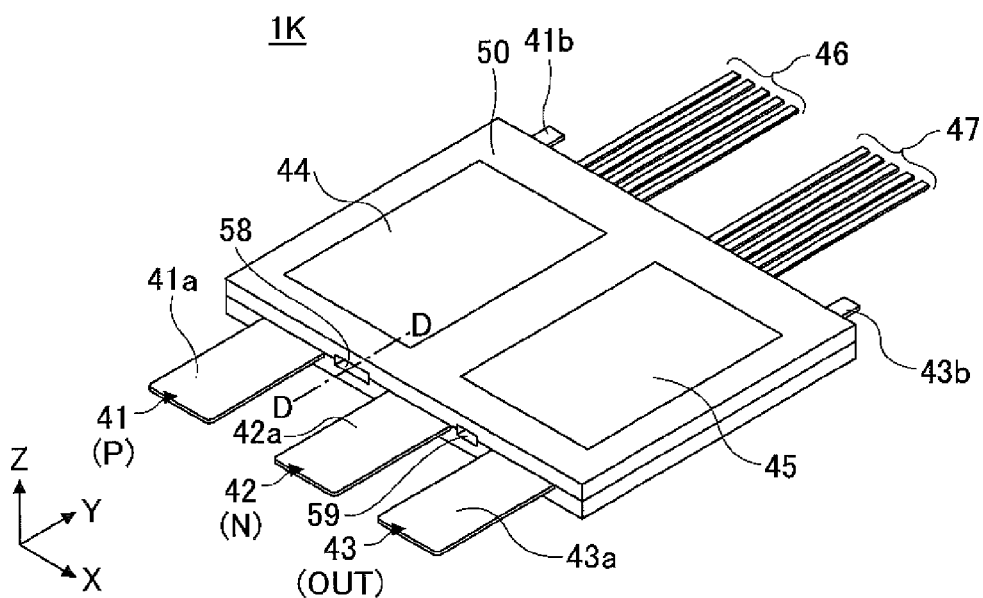
FIG. 21 is a perspective view illustrating an example of the semiconductor apparatus according to a tenth variant of the first embodiment.
Figure 22:
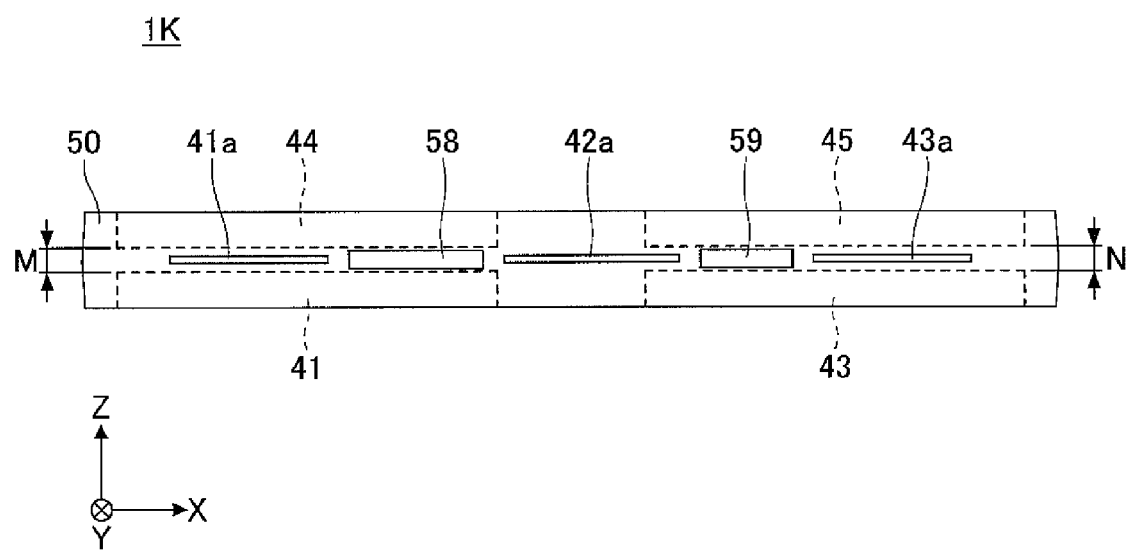
FIG. 22 is a plane view illustrating an example of the semiconductor apparatus according to the tenth variant of the first embodiment.
Figure 23:
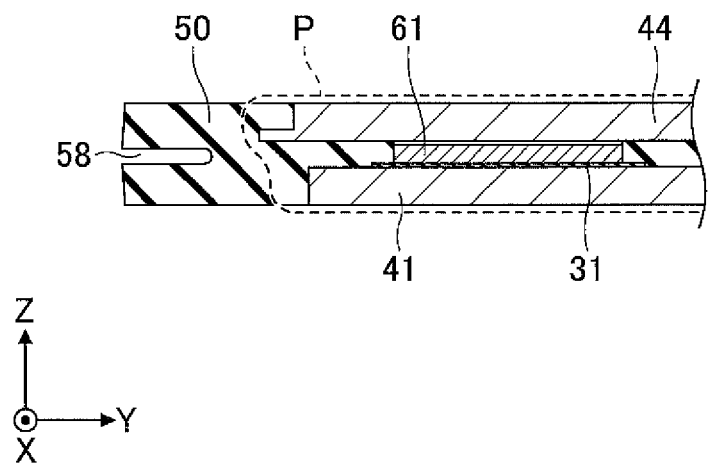
FIG. 23 is a cross-sectional view along a line D-D in FIG. 21 illustrating an example of the semiconductor apparatus according to the tenth variant of the first embodiment.

FIG. 21 is a perspective view illustrating an example of the semiconductor apparatus according to a tenth variant of the first embodiment. FIG. 22 is a front view illustrating an example of the semiconductor apparatus according to the tenth variant of the first embodiment. FIG. 23 is a cross-sectional view along a line D-D in FIG. 21 illustrating an example of the semiconductor apparatus according to the tenth variant of the first embodiment. Referring to FIGS. 21 through 23, a semiconductor apparatus 1K differs from the semiconductor apparatus 1 (see FIG. 2, etc.) in that the concave portions 51 and 52 are omitted and concave portions 58 and 59 are provided at different locations.

The concave portion 58 is recessed from the front surface of the sealing resin 50 in a direction toward a side of the diode 31 opposed to the front surface in a plane view (through-view), and partially includes a rounded shape. The concave portion 58 is provided between the high-voltage side power supply terminal 41a and the low-voltage side power supply terminal 42a in X direction. Further, the concave portion 58 is provided outside of a heating area P near the metal plates 41 and 44 in Y direction. The metal plates 41 and 44 function as radiator plates. Further, the concave portion 58 is provided in such a region M that does not overlap with the metal plates 41 and 44 in Z direction.

In this way, the concave portion 58 is such a configuration that has an opening at a substantially center potion of the front surface of the sealing resin 50 in Z direction (thickness direction) and is recessed toward the side of the diode 31. The concave portion 58 is provided such that the concave portion 58 does not pass through the sealing resin 50 in Z direction. It is noted that the rounded shape included in the concave portion 58 May be the same as that of the concave portion 51, etc., (see FIG. 7, etc.).

The concave portion 59 is recessed from the front surface of the sealing resin 50 in a direction toward a side of the diode 32 opposed to the front surface in a plane view (through-view), and partially includes a rounded shape. The concave portion 59 is provided between the low-voltage side power supply terminal 42a and the output terminal 43a in X direction. Further, the concave portion 59 is provided outside of a heating area (corresponding to the heating area P) near the metal plates 43 and 45 in Y direction. The metal plates 43 and 45 function as radiator plates. Further, the concave portion 59 is provided in such a region N that does not overlap the metal plates 43 and 45 in Z direction.

In this way, the concave portion 59 is such a configuration that has an opening at the substantially center potion of the front surface of the sealing resin 50 in Z direction (thickness direction) and is recessed toward the side of the diode 32. The concave portion 59 is provided such that the concave portion 59 does not pass through the sealing resin 50 in Z direction. It is noted that the rounded shape included in the concave portion 59 may be the same as that of the concave portion 51, etc., (see FIG. 7, etc.).

It is noted that "outside of the heating area" corresponds to a region that is not affected by the heat of the semiconductor element when the heat distribution is measured. In other words, "outside of the heating area" corresponds to a region whose temperature does not increase due to the operations of the semiconductor element.

Figure 24:
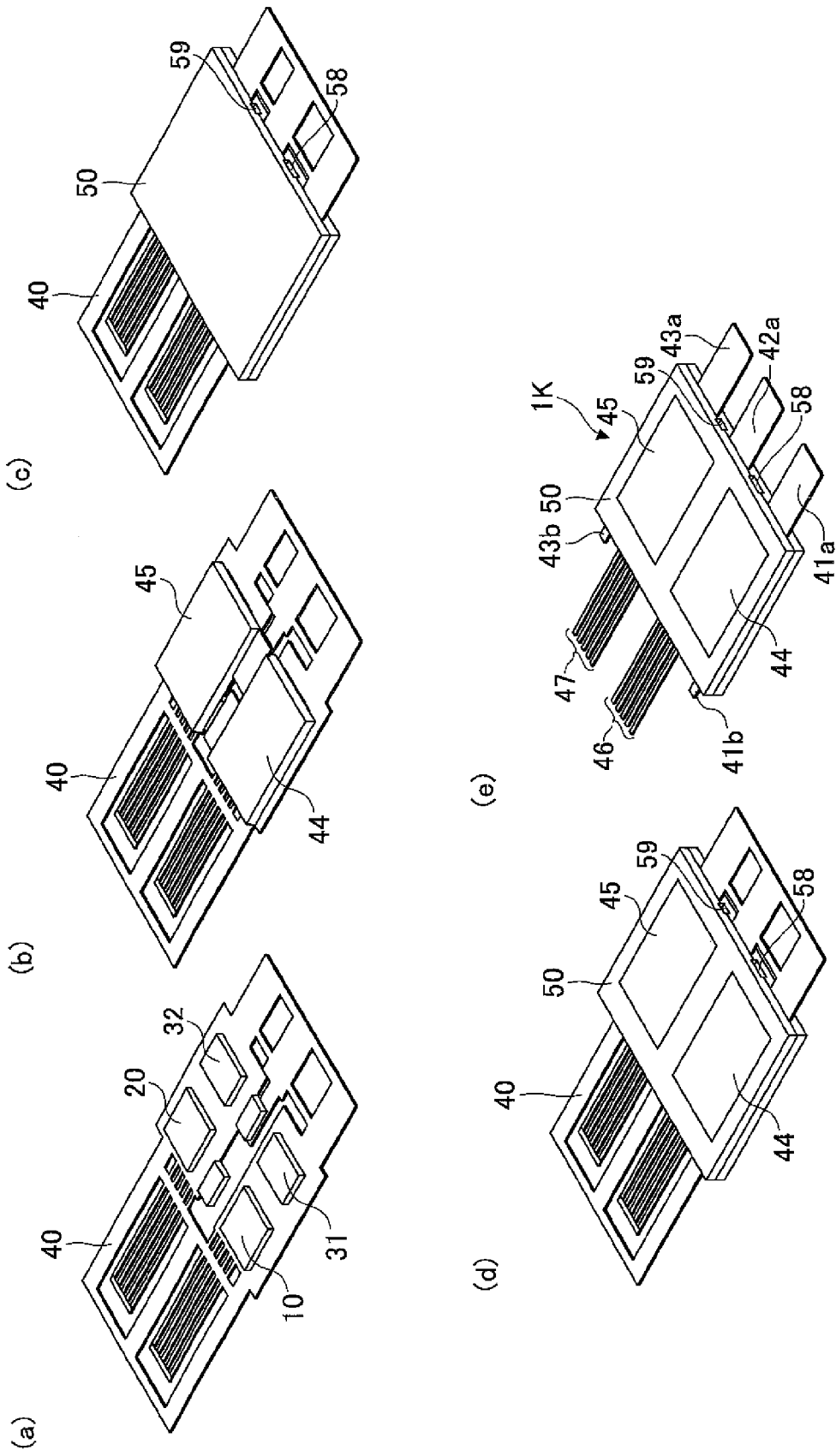
FIG. 24 is a plane view (No. 1) illustrating an example of a production process of the semiconductor apparatus according to the tenth variant of the first embodiment.

Next, a way of manufacturing the semiconductor apparatus according to the tenth variant of the first embodiment is described. FIGS. 24 and 25 are diagrams illustrating an example of a production process for the semiconductor apparatus according to the tenth variant of the first embodiment.

At first, in a process illustrated in FIG. 24(*a*), a lead frame 40 that has a predetermined shape by press working or the like is prepared. Then, the IGBTs 10 and 20 and the diodes 31 and 32 are installed on predetermined locations on the lead frame 40 via the electrically conductive bonding material (not illustrated) such as a tin-based solder, etc. After that, the electrically conductive spacer 61 (not illustrated; see FIGS. 4 and 5) is installed on the IGBT 10 and the diode 31, and the electrically conductive spacer 62 (not illustrated; see FIGS. 4 and 5) is installed on the IGBT 20 and the diode 32.

Next, in a process illustrated in FIG. 24(*b*), after the wire bonding has been performed, the metal plate 44 is installed on the spacer 61 via the electrically conductive bonding material (not illustrated) such as a tin-based solder, etc. Further, the metal plate 45 is installed on the spacer 62 via the electrically conductive bonding material (not illustrated) such as a tin-based solder, etc. After that, a primer (polyamide resin, etc.) is applied.

Next, in a process illustrated in FIG. 24(*c*), molding is performed to form the sealing resin 50. Specifically, as illustrated in FIG. 25(*a*), a slide die 203 is inserted between a upper die 201 and a lower die 202, and the upper die 201 is moved to the lower die 202 to bring the upper die 201 into intimate contact with the lower die 202. Then, as illustrated in FIG. 25(*b*), the resin is injected from the resin injection inlet into space defined by the upper die 201 and the lower die 202 to form the sealing resin 50.

Then, as illustrated in FIG. 25(*c*), the upper die 201 and the lower die 202 are opened and the slide die 203 is pulled out. In this way, the sealing resin 50 including the concave portion 58 is formed. It is noted that, although it is not illustrated, another slide die 203 is inserted at a location where the concave portion 59 is to be formed. Thus, the concave portion 59 is formed simultaneously with the concave portion 58. At that time, when tips of the slide dies 203 have rounded shapes, the rounded shapes are transferred to the concave portions 58 and 59 on the side of the semiconductor elements.

Next, in a process illustrated in FIG. 24(*d*), the upper portion of the sealing resin 50 is cut away such that the upper surfaces of the metal plates 44 and 45 are exposed. Then, in a process illustrated in FIG. 24(*e*), the lead frame 40 is cut at predetermined locations such that the high-voltage side power supply terminal 41a, the low-voltage side power supply terminal 42a, the output terminal 43a, the suspending lead terminals 41b and 43b, and the control electrode terminals 46 and 47 are formed. With this arrangement, the semiconductor apparatus 1K illustrated in FIGS. 21 through 23 is completed.

According to the tenth variant of the first embodiment, as in the first embodiment, etc., even if the concave portion is provided on the side of the high-voltage terminals, the creepage distance between the neighboring terminals can be increased, which improves insulation characteristics, without increasing a size of the semiconductor apparatus.

Further, by providing the concave portion outside of the heating region, the stress due to the difference in coefficients of thermal expansion between the metal plate and the sealing resin can be reduced. Further, the rounded shape of the concave portion on the side of the semiconductor element can distribute the stress, which enables further reducing the stress due to the difference in coefficients of thermal expansion between the metal plate and the sealing resin. As a result, it becomes possible to prevent the cracking of the sealing resin due to the stress.

The preferred embodiments and variants thereof are described above in detail. However, it should be understood that the present invention is not limited to the above-described embodiments, and other embodiments, variations thereof, additions and eliminations may be made within the scope contemplated by those skilled in the art.

For example, according to the embodiment, the semiconductor apparatus in which a plurality of semiconductor elements (the IGBTs and the diodes) are arranged side by side in lateral and longitudinal directions is explained as an example; however, the present disclosure can be applied to such a semiconductor apparatus in which two semiconductor elements, each of which integrally includes the IGBT and the diode, are arranged, etc. Alternatively, the present disclosure may be applied to such a semiconductor apparatus in which a semiconductor element integrally includes the IGBT and the diode, etc. In this case, the number of the concave portions that is provided on the back side of the semiconductor apparatus may be one.

Further, according to the embodiment, the concave portion 51 is provided between the suspending lead terminal 41b and one of the control electrode terminals 46, and the concave portion 52 is provided between the suspending lead terminal 43b and one of the control electrode terminals 47. However, the concave portions 51 and 52 may be provided at other locations. For example, the concave portion 51 may be provided between the neighboring control electrode terminals 46, and/or the concave portion 52 may be provided between the neighboring control electrode terminals 47. Also in this case, the same effects as those of the first embodiment, etc., can be obtained.

Further, the embodiments described above may be combined, if appropriate.

The present application is based an Japanese Priority Application No. 2013-253583, filed on Dec. 6, 2013, and Japanese Priority Application No. 2014-046593, filed on Mar. 10, 2014, the entire contents of which are hereby incorporated by reference.

What is claimed is:

1. A semiconductor apparatus, comprising: a semiconductor element provided on a plane;
   a sealing resin that seals the semiconductor element;
   a terminal that is electrically connected to the semiconductor element and includes a part that projects from a predetermined surface of the sealing resin; and
   a concave portion that is recessed toward a side of the semiconductor element from the same predetermined surface from which the part of the terminal projects, when viewed in a direction perpendicular to the plane,
   a side of the concave portion on the side of the semiconductor element including a rounded shape, when viewed in the direction perpendicular to the plane.

2. The semiconductor apparatus of claim 1, wherein a resin injection inlet for injecting a resin that forms the sealing resin is provided at a first corner portion that is formed such that the first corner portion includes a part of the predetermined surface.

3. The semiconductor apparatus of claim 1, wherein
   a metal plate, which includes a notch at a corner on a side of the predetermined surface, is provided, and
   the concave portion is provided at a position that corresponds to the notch.

4. The semiconductor apparatus of claim 1, wherein
   an insulation element, which is harder than the sealing resin, is inserted in the concave portion, and
   an end of the insulation element projects from the predetermined surface.

5. The semiconductor apparatus of claim 2, wherein a weld line is formed at a second corner portion that is diagonally opposite to the first corner portion.

6. The semiconductor apparatus of claim 1, further comprising:
   a plurality of terminals that include portions that project from the predetermined surface of the sealing resin, wherein
   the semiconductor element is installed on a second metal plate, and
   an end of the second metal plate projects from the predetermined surface to form a part of the terminals.

7. The semiconductor apparatus of claim 1, wherein a plurality of second semiconductor elements are provided on the plane such that the semiconductor element and the second semiconductor elements are arranged side by side in lateral and longitudinal directions.

8. The semiconductor apparatus of claim 1, wherein
   the terminal includes a plurality of high-voltage terminals, and
   the concave portion includes a plurality of concave portions that are provided between the neighboring high-voltage terminals and outside of heating areas.

9. The semiconductor apparatus of claim 8, wherein the concave portions are formed by a die that is inserted when injecting a resin for forming the sealing resin.

10. The semiconductor apparatus of claim 8, wherein the concave portions are provided such that the concave portions do not pass through the sealing resin in the direction perpendicular to the plane.

* * * * *